United States Patent [19]

Short et al.

[11] Patent Number: 4,739,514
[45] Date of Patent: Apr. 19, 1988

[54] AUTOMATIC DYNAMIC EQUALIZING

[75] Inventors: William R. Short, Wellesley; Malcolm Chellquist, Holliston, both of Mass.

[73] Assignee: Bose Corporation, Framingham, Mass.

[21] Appl. No.: 945,282

[22] Filed: Dec. 22, 1986

[51] Int. Cl.⁴ ............................................. H03G 5/00
[52] U.S. Cl. ..................................... 381/103; 381/98; 381/109; 381/106; 333/14; 333/28 T
[58] Field of Search .................. 333/14, 28 T; 381/98, 381/101, 102, 103, 109, 106

[56] References Cited

U.S. PATENT DOCUMENTS

| | | | |
|---|---|---|---|
| 4,055,818 | 10/1977 | Gay | 381/101 |
| 4,130,727 | 12/1978 | Kates | 381/98 |
| 4,239,939 | 12/1980 | Griffis | 381/17 |
| 4,289,928 | 9/1981 | Takaoka et al. | 381/101 |
| 4,376,916 | 3/1983 | Glaberson | 333/14 |
| 4,398,157 | 8/1983 | Dieterich | 381/106 |
| 4,412,100 | 10/1983 | Orban | 381/106 |
| 4,432,097 | 2/1984 | Okada et al. | 381/98 |
| 4,451,746 | 5/1984 | Hirose et al. | 333/14 |
| 4,462,008 | 7/1984 | Katakura | 333/14 |
| 4,490,843 | 12/1984 | Bose et al. | 381/102 |
| 4,538,297 | 8/1985 | Waller, Jr. | 381/106 |
| 4,661,851 | 4/1987 | Muterspaugh | 381/106 |
| 4,668,988 | 5/1987 | Sasaki et al. | 333/14 |

Primary Examiner—Forester W. Isen
Attorney, Agent, or Firm—Charles Hieken

[57] ABSTRACT

An automatic dynamic equalizer includes left and right input terminals, an input adder and left and right output adders. The left and right input terminals are connected to inputs of the input adder and inputs of the left and right output adder, respectively. The output of the input adder is connected to the input of a 2:1 compressor. The output of the 2:1 compressor is connected to the input of a bandpass filter having a transmission in the low bass frequency region centered at a frequency of about 60 Hz. The output of the bandpass filter is coupled to inputs of the left and right output adders.

10 Claims, 5 Drawing Sheets

AUTOMATIC DYNAMIC EQUALIZING

The present invention relates in general to dynamic equalizing and more particularly concerns novel apparatus and techniques for achieving the advantages of controlling frequency response of a sound amplifying system as a function of level without introducing undesired boominess in voice reproduction as disclosed in U.S. Pat. No. 4,490,843, but independently of the volume control. These advantages may thus be achieved with systems, such as after-market car stereo systems and powered loudspeaker systems, such as the commercially available BOSE ROOMMATE system, having a conventional volume control before the power amplification stages.

That patent explains how conventional loudness contour circuits are based upon Fletcher-Munson curves which relate the frequency response of a human to the level of the sound being heard. It was discovered that even though the Fletch-Munson equal-loudness curves predict that one should boost the frequencies between 200 and 500 Hz, very satisfactory musical performance was obtained by limiting the frequencies to be booster to those below 150 Hz while avoiding the undesirable effects of boominess in the reproduction of voices. There was discovered and disclosed a family of frequency contours which vary with volume control setting that improve the perceived low level music reproduction and do not degrade voice reproduction.

The present invention also represents an advance over the Aiwa dynamic super loudness (DSL) circuit commercially available and described in service manuals. This DSL circuit comprises an equalizer circuit that boosts bass and treble, a detector circuit which judges the strength of the sound level and a control circuit which suppresses the DSL characteristics when the sound level is high. The control circuit is the same as an automatic level control (ALC) circuit used for normal recording, except that its attack time and recovery time are extremely short. The DSL circuit output is differentially combined with an input signal derived from the volume control in the main amplifier circuit. When the signal level is low, the DSL circuit feeds a strong signal having bass and treble greatly boosted. However, when the signal level is high, the DSL circuit output is suppressed.

It is an important object of this invention to provide improved automatic loudness compensation.

It has been discovered from observing the desired dynamic equalization frequency response curves in FIG. 6 of the aforesaid patent that whenever the midband gain drops by substantially 10 decibels, the gain in a narrow band of the low bass frequency range should drop by only 5 decibels, and this two-to-one ratio extends over a wide range of gains. Apparatus according to the invention comprises an input terminal for receiving signals from a unit with a conventional volume control, compressing means having its input coupled to said input terminal for compressing the dynamic range of signals on the input terminal by substantially two, dynamic equalization bandpass filter means coupled to the output of said compressing means for providing a dynamically equalized compressed signal, and combining means for combining the signal on the input terminal with a dynamically equalized compressed signal for providing an automatically dynamically equalized signal for delivery to the power amplifier and then the loudspeakers. According to another aspect of the invention, there may be input filter means intercoupling the input terminal and the compressing means for preventing the compressing means from changing its gain for signals having spectral components that should not alter compressor gain. For example, the input filter means may be a high pass filter allowing the compressing means to vary its gain depending only on mid and high frequency spectral component levels. The compression ratio need not be fixed at 2:1, but might be made some other ratio or vary as a function of level to realize more exactly preferred desired equalization curves. The attack and decay time of the compressing means may be altered to minimize artifacts. The compressing means may be in a channel common to both left and right stereo channels to allow dynamic equalization with a single dynamic equalization channel without significantly altering stereo effects.

Numerous other features, objects and advantages of the invention will become apparent from the following specification when read in connection with the accompanying drawing in which.

Figure 1:
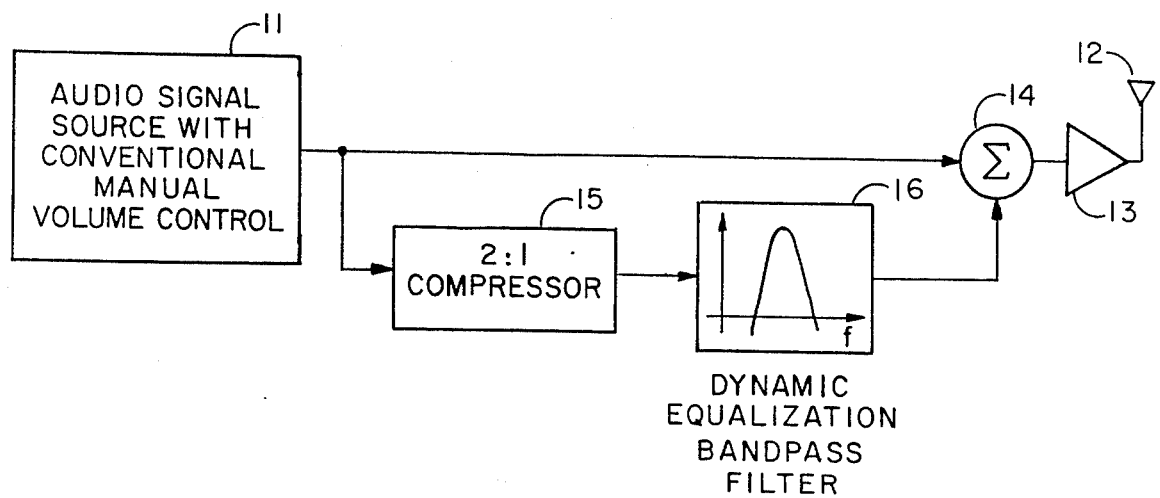
FIG. 1 is a block diagram illustrating the logical arrangement of a system according to the invention.

With reference now to the drawing and more particularly FIG. 1 thereof, there is shown a block diagram illustrating the logical arrangement of a system according to the invention. The signal provided by an audio signal source 11 having a conventional manual volume control is transduced by loudspeaker 12 energized by power amplifier 13 with perceived tonal balance corresponding substantially to that of the original sound independently of volume control setting. The output of audio signal source 11 is coupled directly to one input of signal combiner 14 and to the input of 2:1 compressor 15 in a side channel. The output of compressor 15 is coupled to a dynamic equalization bandpass filter 16, typically centered at a low bass frequency corresponding substantially to the nominal low frequency cutoff of the system, usually the loudspeaker system nominal low frequency cutoff, typically a frequency within the range of 55-70 Hz. The output of dynamic equalization bandpass filter 16 is coupled to the other input of signal combiner 14. The output of signal combiner 14 is coupled to the input of power amplifier 13.

Figure 2:
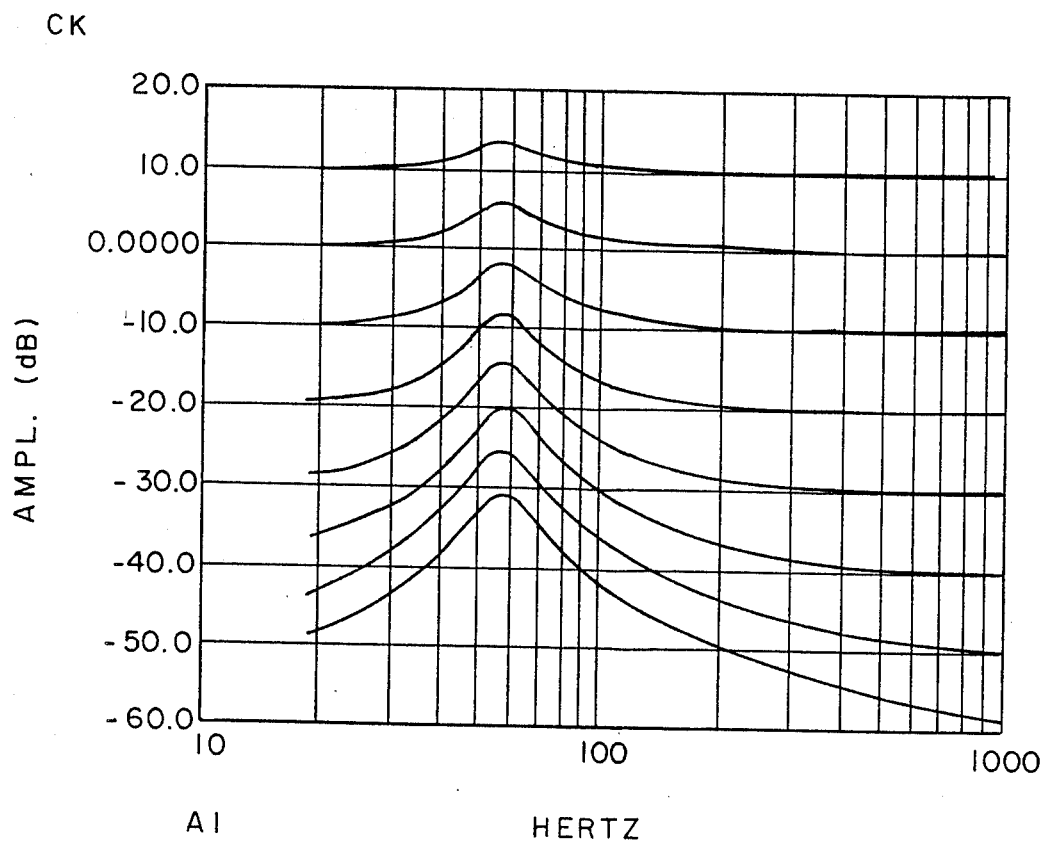
FIG. 2 is a graphical representation of a family of equalization responses achieved with the system of FIG. 1.

The system of FIG. 1 may be regarded as providing a main forward signal path which carries an unmodified version of the audio signal provided by signal source 11 through combiner 14 to power amplifier 13. In addition there is a side path comprising compressor 15 and dynamic equalization bandpass filter 16 for processing the input signal and delivering means 14 for adding back to the main forward path signal to create a desired set of dynamic equalization curves, such as shown in FIG. 2. The gain of 2:1 compressor 15 decreases by one decibel for every two decibels that the signal on its input decreases. The specific form of dynamic equalization bandpass filter 16 may be similar to that disclosed in the aforesaid patent. However, the manual volume controls are eliminated from the dynamic equalization circuitry. Thus, the invention provides the dynamic equalization function of the aforesaid patent that may be used with a conventional audio signal source having a conventional manual volume control, such as a vehicle tuner or portable cassette player, compact disk player or receiver.

Figure 3:
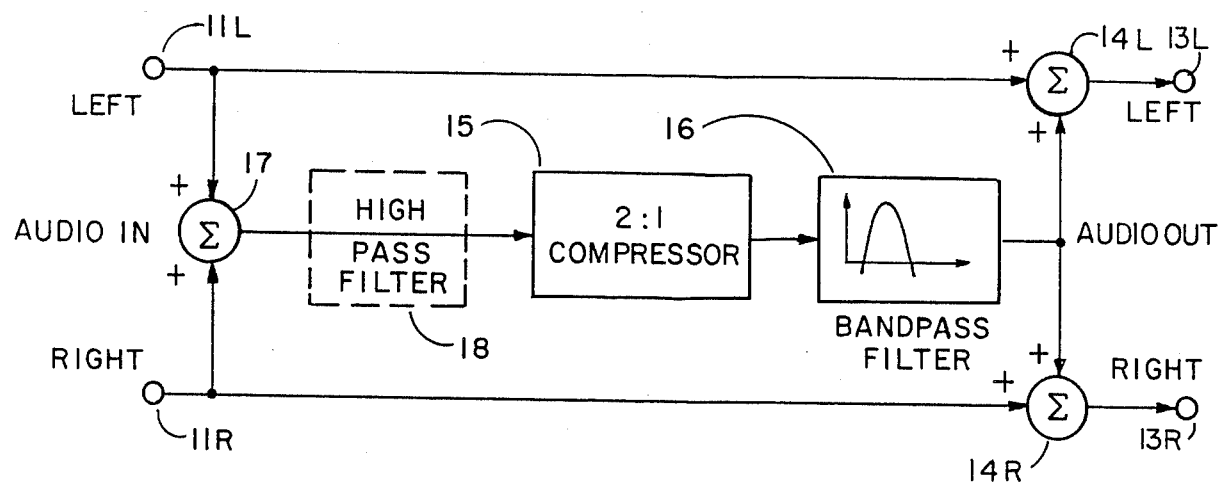
FIG. 3 is a block diagram illustrating the logical arrangement of a stereo system according to the invention in which both stereo channels share a common automatic dynamic equalization system.

Referring to FIG. 3, there is shown a block diagram illustrating the logical arrangement of a system according to the invention in which left and right stereo channels share the side channel comprising 2:1 compressor 15 and dynamic equalization bandpass filter 16. Left and right input terminals 11L and 11R receive left and right audio input signals, respectively, from a stereo audio signal source and energize one input of left and right output signal combining means 14L and 14R, respectively, in the left and right forward through channels, respectively. Input signal combining means 17 has left and right inputs connected to left and right input terminals 11L and 11R, respectively, to provide a combined input signal in a common side channel that is delivered to 2:1 compressor 15. The output of dynamic equalization bandpass filter 16 is delivered to the other inputs of left and right output signal combining means 14L and 14R, respectively, for delivery to left and right output terminals 13L and 13R, respectively, connected to respective left and right power amplifiers and loudspeakers (not shown in FIG. 3), similar to power amplifier 13 and loudspeker 12 shown in FIG. 1. If desired a filter, such as high pass filter 18 shown as a broken-line box in FIG. 3, may be interposed between the output of input signal combining means 17 and 2:1 compressor 15. This filter prevents compressor 15 from changing its gain in response to spectral components that preferably should not change gain. For example, a high pass filter 18, typically having a cutoff frequency at 150 Hz, allows 2:1 compressor 15 to vary its gain only in response to mid and high frequency spectral components, which control the gain to provide an overall perceived loudness more closely resembling the perceived loudness of the original sound source heard live.

The compression ratio need not be restricted to 2:1, but might be some other ratio to realize more exactly certain desired equalization curves. Further, the compression ratio might be made variable as a function of input level to fit even more closely desired equalization curves. The attack and decay time of compressor 15 may be altered to minimize artifacts.

Figure 4:
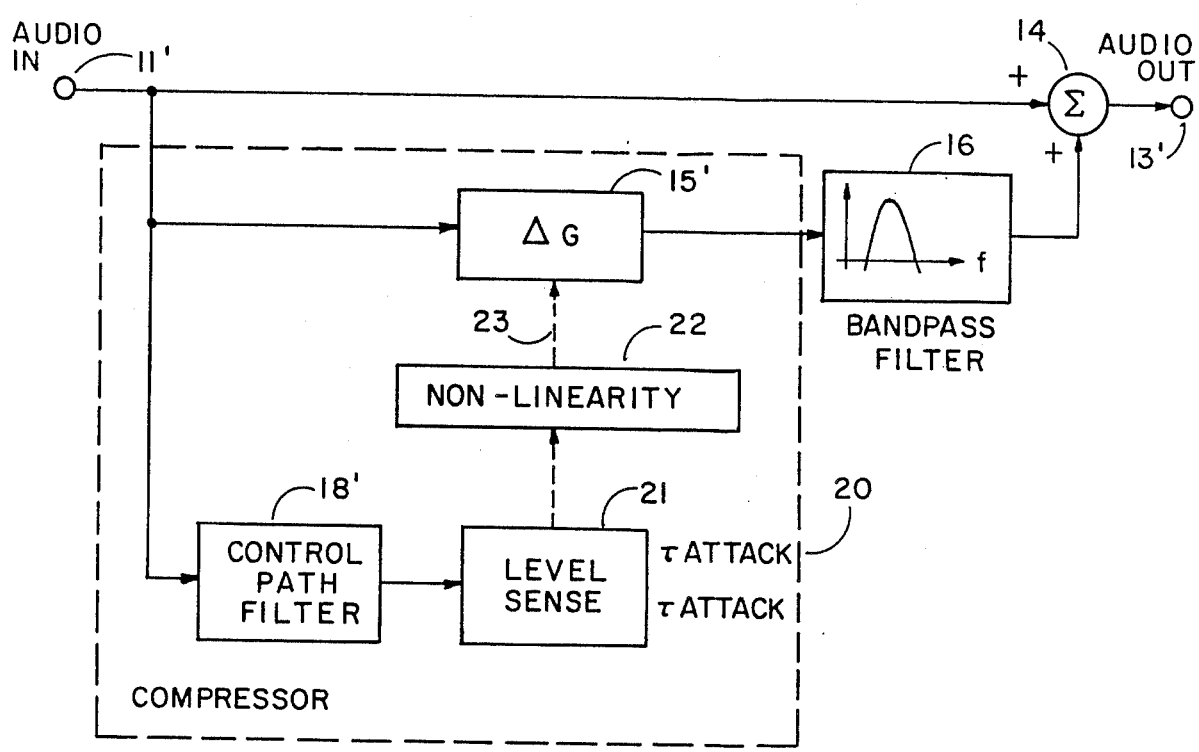
FIG. 4 is a block diagram illustrating the logical arrangement of a variation of the system of FIG. 1 for controlling attack and decay time.

Referring to FIG. 4, there is shown an alternate embodiment of the invention having some of these features. The system of FIG. 1 is modified by having a controlled compressing system 20 in the side path. This controlled compressing system includes control path filter 18', that may correspond substantially to high pass filter 18, and energizes level sensor 21. Level sensor 21 includes delay circuirty for delaying the change in output signal in accordance with a desired attack time constant and decay time constant to provide a delayed level signal to nonlinear network 22 having a nonlinear transfer characteristic that provides a gain control signal on line 23 to compressor 15'. A typical suitable attack transient has a time constant of 0.1 second and a suitable decay transient typically has a time constant of 0.1 second. Nonlinear network 22 may have its transfer characteristic such as to more closely approximate the frequency response as a function of maximum volume shown in FIG. 6 of the aforesaid patent.

Figure 5:
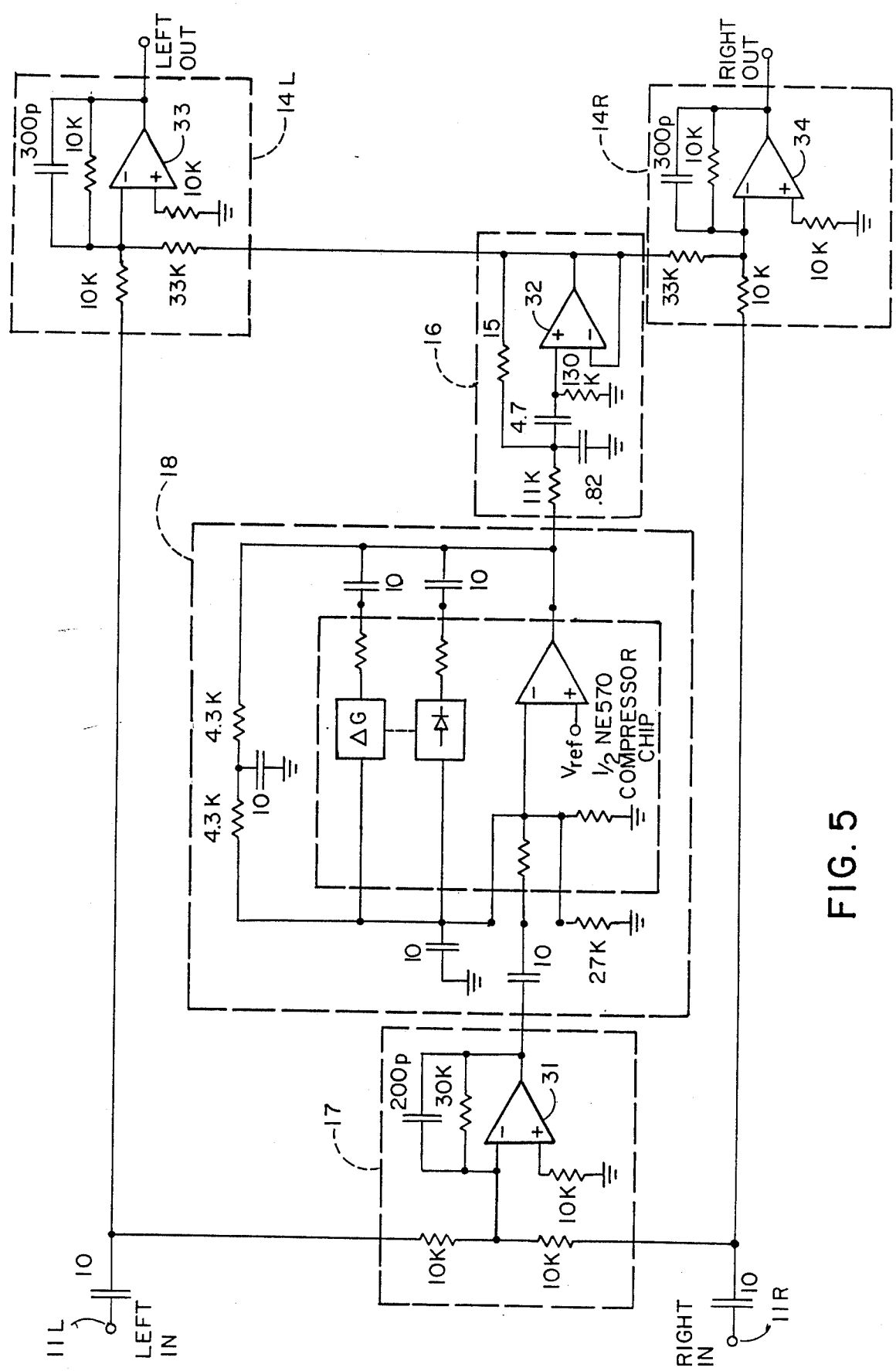
FIG. 5 is a combined block-schematic circuit diagram of an exemplary working embodiment of the invention.

Referring to FIG. 5, there is shown a schematic circuit diagram of an actual operating embodiment of the invention corresponding substantially to the block diagram of FIG. 3 with specific parameter values set forth. Summing circuitry 17 comprising operation amplifier 31 sums the input signals to the left and right channels received on input terminals 11L and 11R, respectively. This sum signal is delivered to the 2:1 compressor 18 comprising half of an NE570 compressor chip. The compressed output is delivered to dynamic equalization filter 16 comprising operational amplifier 32. Summers 14L and 14R sum the output of dynamic equalization filter 16 with the left and right input signals, respectively, received on input terminals 11L and 11R, respectively. Operational amplifiers 31-34 may be any general purpose operational amplifier, such as $\frac{1}{4}$ of a TL074 chip.

The present invention is functionally and structurally different from the Aiwa DSL system. The latter system uses essentially a conventional ALC circuit used in tape recorders, except for the shorter attack and decay transients. Such a circuit keeps a nearly constant output for a wide range of inputs until the input drops below a given level. Below that level, input and output levels track. In contrast, the present invention uses compressor means having a gain inversely proportional to the level of the signal on the input terminal, preferably arranged so that for every 2 dB increase in input level, there is a 1 dB increase in output level over a wide range of input levels. The results of this difference is that in the systems having the DSL circuitry, below a certain level at which substantially no boost is imparted, the bass boost imparted is substantially the same regardless of input signal level whereas in the present invention, there is progressively more bass boost as the input signal level decreases over a wide range of input signal levels.

Figure 7:
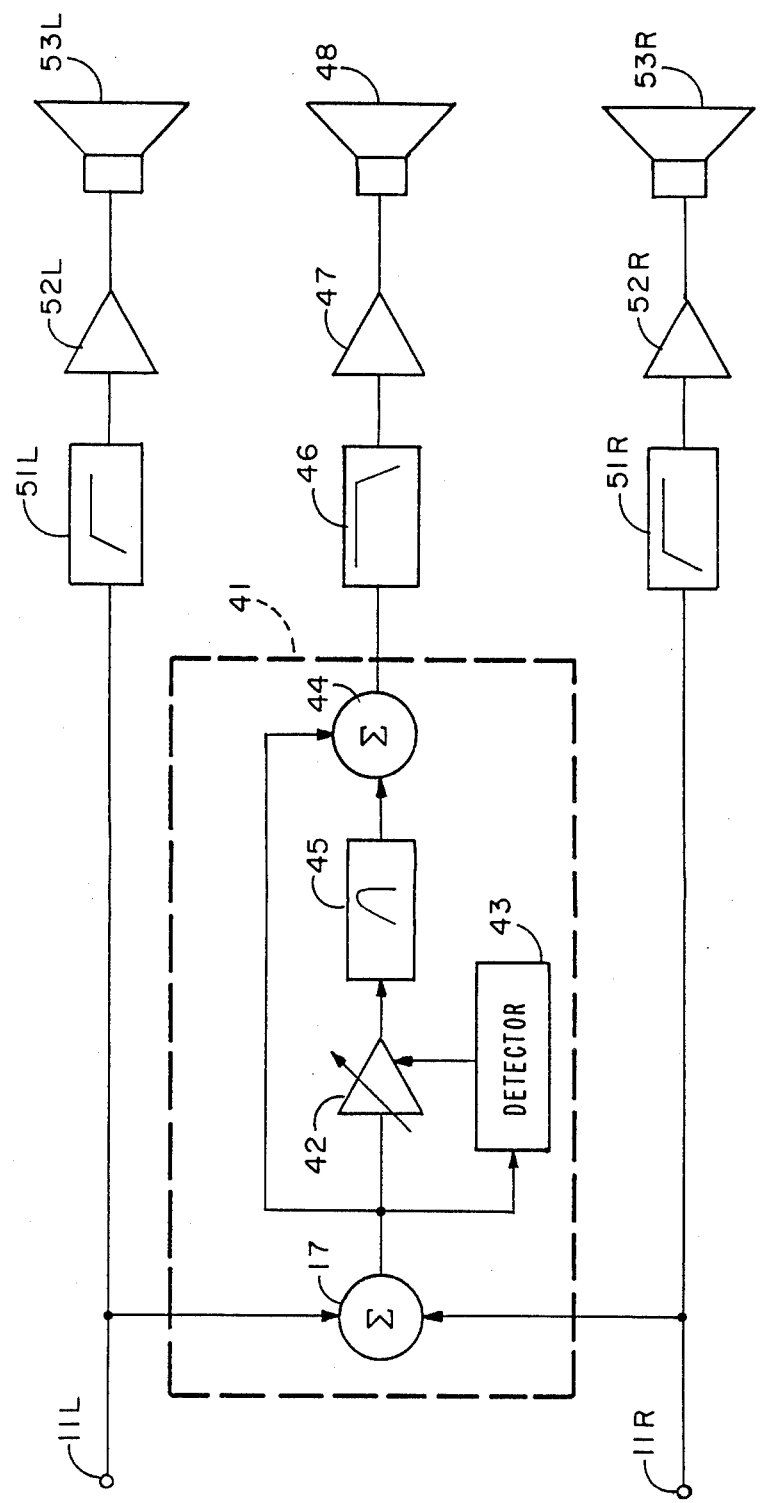
FIG. 7 is a combined block-schematic circuit diagram of a monophonic automatic dynamic equalization channel.

Referring to FIG. 7, there is shown a block diagram illustrating the logical arrangement of a system having dynamic equalization in only a bass channel. The automatic dynamic equalization circuitry 41 comprises input summer 17 that combines the left and right stereo signals received on left input terminal 11L and right input terminal 11R to provide a combined signal that is delivered to variable gain amplifier 42, the input of detector 43 and one input of output summer 44. The output of detector 43 is applied to the gain control input of variable gain amplifier 42 to control the gain of amplifier 42 in accordance with the amplitude of the combined input signal. 60 Hz bandpass filter 45 couples the output of amplifier 42 to the other input of output summer 44. Low pass filter 46 couples the dynamically equalized signal from output summer 44 to bass power amplifier 47 that drives woofer 48.

Left and right high pass filters 51L and 51R couple the left and right signals on left and right input terminals 11L and 11R, respectively, to left power amplifier 52L and right power amplifier 52R, respectively, which energize left tweeter 53L and right tweeter 53R, respectively. This arrangement provides automatic dynamic equalization in the bass channel where needed in the essentially nondirectional bass channel while maintaining the separation of the left and right signals at higher frequencies where a listener perceives directionality, and dynamic equalization is ordinarily not needed, to preserve the stereo effect perceived by the listener.

Figure 6:
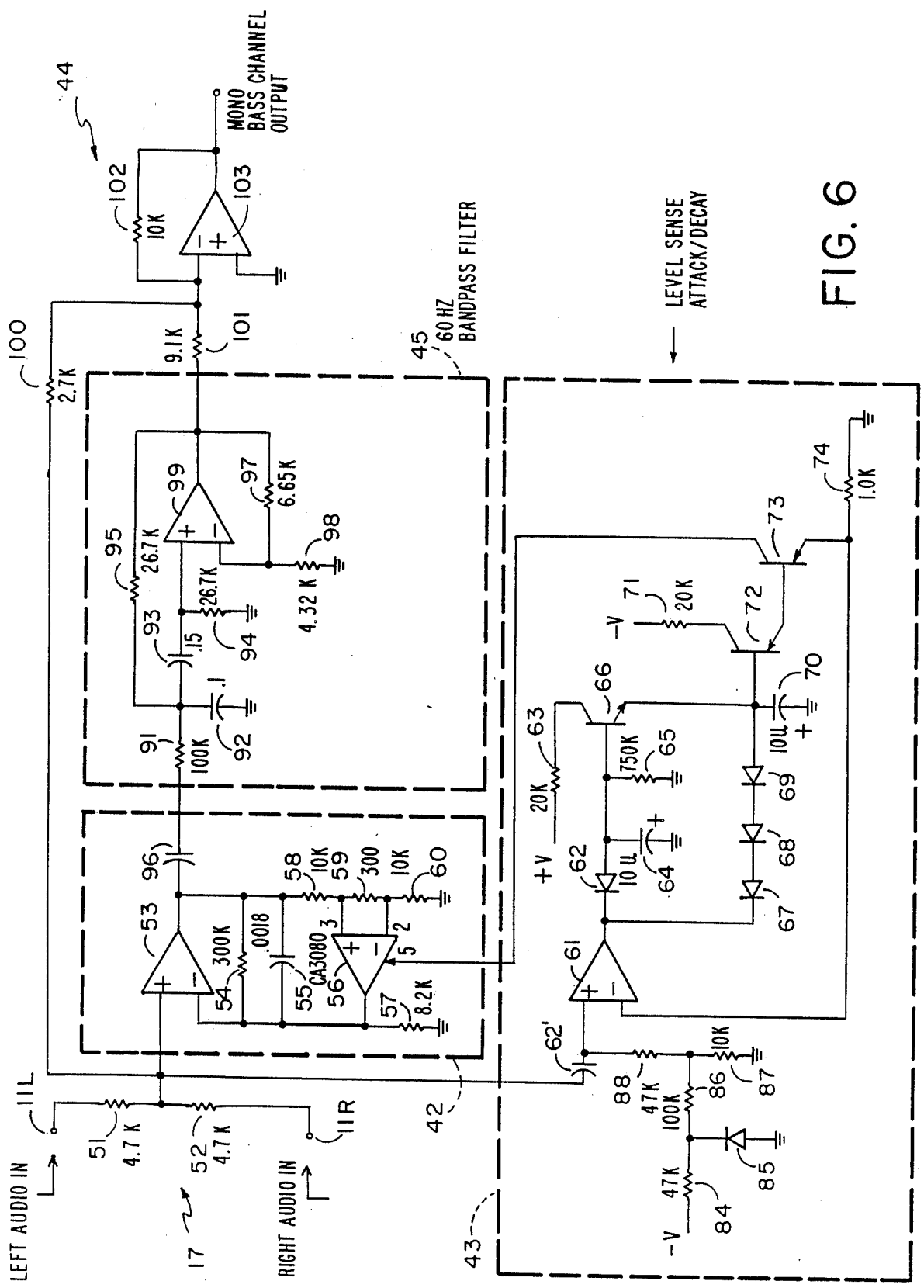
FIG. 6 is a block diagram illustrating the logical arrangement of a system having dynamic equalization only in a bass channel.

Referring to FIG. 6, there is shown a schematic circuit diagram of the automatic dynamic equalization circuitry 41. Resistors 51 and 52 comprise summer 17 and provide a combined monophonic source signal to amplifier 53. Amplifier 53 and transconductance amplifier 56 with components resistor 54, capacitor 55, resistor 57 resistor 58, resistor 59 and resistor 60 comprise linear variable gain stage 42. The gain of variable gain stage 42 is inversely proportional to the D.C. current injected into pin 5 of amplifier 56.

The combined monophonic source signal is also applied to level detector amplifier 61 through blocking capacitor 62'. Amplifier 61 and associated components including diode 62, resistor 63, capacitor 64, resistor 65, transistor 66, diode 67, 68 and 69, capacitor 70, resistor 71, transistors 72 and 73 and resistor 74 comprise a closed loop precision negative peak detector circuit with specific attack, hold and release characteristics used to control the current to terminal 5 of transconductance amplifier 56 and thus the gain of the linear variable gain stage 42.

A negative rising signal amplitude at the non-inverting input (+) of amplifier 61 causes amplifier 61 to conduct through series diodes 67, 68 and 69, Darlington configured transistors 72 and 73 and resistor 74. Negative loop feedback forces the voltage across resistor 74 to equal that at the noninverting input (−) of amplifier 61. This action occurs quickly, with a typical attack time of one millisecond.

After the signal amplitude at the noninverting input of amplifier 61 drops, holding capacitor 70 maintains peak voltage across resistor 74 for about four seconds until transistor 66 conducts and discharges capacitor 70 through resistor 63.

Transistor 66 begins to conduct when the voltage across negatively charged capacitor 64, discharging through resistor 65, becomes positive enough to forward-bias the bass-emitter junction of transistor 66. Diodes 68 and 69 provide a 1.2 voltage reverse bias across the bass-emitter junction of transistor 66. Diodes 68 and 69 provide a 1.2 voltage reverse bias across the bass-emitter junction of transistor 66 during initial peak charging of capacitors 64 and 70.

Transistor 73 converts the peak detected voltage across resistor 74 to current for controlling the gain of transconductance amplifier 56. Diode 85 and resistors 84 and 86-88 provide a minimum negative D.C. bias of 50 millivolts at the noninverting input of amplifier 61, which limits the minimum amount of injection current to amplifier 56.

Amplifier stage 99 comprises 60 Hz bandpass filter 45 and is characterized by appropriate high frequency psychoacoustic roll off characteristic. Resistors 100, 101 and 102 and amplifier 103 comprise output summer 44.

Overall operation is such that for peak signal inputs of a volt or more, the frequency response at the output of output summer 44 is virtually flat. As the signal amplitude decreases, there is a gradual and continuous increase in bass boost. Specifically, for each two dB decrease in signal amplitude, there is a corresponding one dB (approximate) increase in low frequency bass response. This relationship is maintained for up to a maximum of 16 dB boost. The ultimate boost is limited to prevent audible hum. This circuitry is embodied in the commercially available Zenith Sound by Bose digital television systems.

There has been described novel apparatus and techniques for providing the electroacoustical benefits of the invention in the aforesaid patent that may be used without gaining access to the volume control and thus allow these electroacoustical advantages to be obtained when energized by conventional audio signal sources having conventional volume controls. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Automatic dynamic equalization apparatus for use with a sound reproducing system having a nominal low frequency cutoff frequency in the low bass frequency range comprising,
   an input terminal,
   an output terminal,
   output combining means having first and second inputs and an output coupled to said output terminal for cummulatively combining signals on said first and second inputs,
   means for coupling said input terminal to said first input to establish a forward signal path for carrying an unmodified representation of the signal on said input terminal,
   means defining a side path for intercoupling said input terminal with said second input to provide a processed input signal to said second input,
   said means defining a side path comprising compressor means having an input coupled to said input terminal and an output having a gain inversely proportional to the level of the signal on said input terminal and dynamic equalization bandpass filter means having an input coupled to the output of said compressing means and an output coupled to said second input for transmitting spectral components within a predetermined low bass frequency range centered at said nominal low cutoff frequency,
   said apparatus coacting to impart between said input and said output terminals negligible boost to voice format spectral components at frequencies at a middle range of frequencies beginning at 200 Hz for different signal levels at said input terminal while significantly changing bass boost in the bass frequency region therebelow as a function of said levels so that at low listening reproduced sound levels of an audio signal on said input terminal, reproduced bass spectral components at said output terminal are perceived by listeners without degrading reproduced voices when carried by said audio signal.

2. Automatic dynamic equalization apparatus in accordance with claim 1 and further comprising,
   an audio signal source having a conventional volume control coupled to said input terminal for providing said audio signal,
   power amplifying means coupled to said output terminal for providing an amplified signal, and electroacoustical transducing means coupled to said power amplifying means for converting said amplified signal into corresponding sound waves.

3. Automatic dynamic equalization apparatus in accordance with claim 1 and further comprising a second input terminal, a second output terminal, input combining means having first and second inputs coupled to said first and second input terminals respectively for combining the signals on the latter terminals to provide an input combined output signal, means for coupling said combined output signal to the input of said compressing means, and a second output combining means having first and second inputs with the first input coupled to said second input terminal by means defining a second forward signal path, the output of said dynamic equalization bandpass filter means being coupled to the second output combining means second input.

4. Automatic dynamic equalization apparatus in accordance with claim 1 and further comprising filter means for coupling said input terminal to the input of said compressor means.

5. Automatic dynamic equalization apparatus in accordance with claim 1 wherein said compressor means includes variable gain means for controlling the gain in said side path, level sensing means for sensing the signal level of said input signal to provide a level signal, nonlinear processing means responsive to said level signal for providing a gain control signal having a predetermined nonlinear relationship between said level signal and said gain control signal, and means for coupling said gain control signal to said gain control means.

6. Automatic dynamic equalization apparatus in accordance with claim 5 wherein said level sensing means is characterized by an attack transient and a decay transient having a time constant substantially of the order of 0.1 second.

7. Automatic dynamic equalization apparatus in accordance with claim 1 wherein said means defining a side path includes control path filter means for preventing said compressor means from changing its gain in response to spectral components below a predetermined low cutoff frequency at the lower end of the middle audio frequency range.

8. Automatic dynamic equalization apparatus in accordance with claim 7 wherein said low cutoff frequency is substantially of the order of 150 Hz.

9. Automatic dynamic equalization apparatus in accordance with claim 1 and further comprising, left and right inputs for receiving left and right stereo signals respectively, input combining means for combining the signals on said left and right inputs to provide a monophonic combined signal at its output, means for coupling said input combining means output to said input terminal, bass channel power amplifying means for amplifying bass signals, low pass filtering means coupling the output of said output combining means to the input of said bass power amplifying means, left and right power amplifying means for amplifying signals related to said left and right signals respectively, and left and right high pass filter means for coupling said left and right inputs respectively to respective inputs of said left and right power amplifying means.

10. Automatic dynamic equalization apparatus in accordance with claim 9 and further comprising, woofer means for transducing bass signals, means for coupling the output of said bass power amplifying means to said woofer means, left and right tweeter means for transducing signals related to said left and right stereo signals respectively, and means for coupling the outputs of said left and right power amplifying means to said left and right tweeter means respectively.

* * * * *